(12) United States Patent
Ni et al.

(10) Patent No.: US 10,964,391 B2
(45) Date of Patent: Mar. 30, 2021

(54) PROGRAMMING CIRCUIT AND PROGRAMMING METHOD OF FLASH MEMORY AND FLASH MEMORY

(71) Applicant: Chengdu Analog Circuit Technology Inc, Chengdu (CN)

(72) Inventors: Hongsong Ni, Chengdu (CN); Ming Wang, Chengdu (CN)

(*) Notice: Subject to any disclaimer, the term of this patent is extended or adjusted under 35 U.S.C. 154(b) by 181 days.

(21) Appl. No.: 16/252,991

(22) Filed: Jan. 21, 2019

(65) Prior Publication Data

US 2019/0189219 A1 Jun. 20, 2019

Related U.S. Application Data

(63) Continuation of application No. PCT/CN2017/116346, filed on Dec. 15, 2017.

(51) Int. Cl.
*G11C 16/10* (2006.01)
*G11C 16/04* (2006.01)
(Continued)

(52) U.S. Cl.
CPC .......... *G11C 16/10* (2013.01); *G11C 16/0433* (2013.01); *H01L 27/11526* (2013.01); *H01L 29/7881* (2013.01)

(58) Field of Classification Search
CPC . G11C 16/10; G11C 11/5628; G11C 16/0466; G11C 2216/06; G11C 16/0433; H01L 27/11526; H01L 29/7881
See application file for complete search history.

(56) References Cited

U.S. PATENT DOCUMENTS

| | | | |
|---|---|---|---|
| 5,912,842 A * | 6/1999 | Chang | G11C 16/0416 365/185.11 |
| 6,195,285 B1 * | 2/2001 | Yamamoto | G11C 16/0433 365/185.03 |

(Continued)

FOREIGN PATENT DOCUMENTS

| CN | 101986389 A | 3/2011 |
|---|---|---|
| CN | 107316657 A | 11/2017 |

OTHER PUBLICATIONS

Internation Search Report of PCT/CN2017/116346, dated Sep. 20, 2018.

*Primary Examiner* — Tuan T Nguyen
(74) *Attorney, Agent, or Firm* — W&K IP

(57) ABSTRACT

The present invention relates to a programming circuit and a programming method of a flash memory, the programming circuit includes a programming transistor and a storage cell connected in series, a gate of the programming transistor is connected to a word line, a gate of the storage cell is connected to a control gate, one end of the programming transistor is connected to a bit line, the other end of the programming transistor is connected to one end of the storage cell, and the other end of the storage cell is connected to a source line. By programming the flash memory by the programming circuit and method of the present invention, the efficiency of latter stage programming can be improved without increasing channel current, thereby improving the efficiency of the entire programming process, shortening the total programming time, and improving the performance of the flash memory.

10 Claims, 5 Drawing Sheets

(51) Int. Cl.
*H01L 27/11526* (2017.01)
*H01L 29/788* (2006.01)

(56) References Cited

U.S. PATENT DOCUMENTS

| | | | |
|---|---|---|---|
| 6,377,490 B1 * | 4/2002 | Takahashi | G11C 16/0416 257/E27.103 |
| 8,320,191 B2 * | 11/2012 | Strenz | G11C 16/10 365/185.27 |
| 8,897,077 B2 * | 11/2014 | Ajika | G11C 16/0483 365/185.23 |
| 8,958,248 B2 * | 2/2015 | van Duuren | G11C 11/5621 365/185.17 |
| 8,982,632 B2 | 3/2015 | Ogawa | |

* cited by examiner

PROGRAMMING CIRCUIT AND PROGRAMMING METHOD OF FLASH MEMORY AND FLASH MEMORY

CROSS-REFERENCE TO RELATED APPLICATIONS

This application is a continuation of International Patent Application No. PCT/CN2017/116346 with a filing date of Dec. 15, 2017, designating the United States. The content of the aforementioned applications, including any intervening amendments thereto, are incorporated herein by reference.

TECHNICAL FIELD

The present invention relates to the technical field of a memory, in particular to a programming circuit and a programming method of a flash memory and the flash memory.

TECHNICAL BACKGROUND

A flash Memory is a non-volatile memory, according to different storage principles, the technology of the flash memory can be divided into a floating gate device and a charge trapping device. For the floating gate device, a charge is stored in a conductor layer or a semiconductor layer that is completely surrounded by a dielectric layer. One metal floating gate and one ultra-thin tunneling oxide layer are added to the conventional MOSFET, and a floating gate is used to store the charge. For the charge trapping device, the charge is stored in a separate trapping center of a suitable dielectric layer, whose threshold voltage is controlled by the amount of the charge stored on silicon nitride. What this kind of the device uses the most commonly are a metal-silicon nitride-silicon oxide-semiconductor (MNOS) and a silicon-silicon oxide-silicon nitride-silicon oxide-silicon (SONOS) memories. The SONOS memory is a single-layer polycrystalline process, has a much simpler process than a floating-gate type flash memory and is easier to be compatible with a standard CMOS process. The integration process thereof has photolithography that is generally only 5-6 times more than that of standard CMOS process, the complicated degree and the cost of the process are greatly reduced, and the charge trapping device exhibits a greater advantage than the floating gate device at a scale below 20 nm.

The biggest difference between a floating gate type flash memory and the SONOS memory is the way in which the charge is stored. This storage mechanism of the SONOS makes the SONOS more advantageous than the floating gate device, especially in a data retention characteristic. In a floating gate structure device, due to the conductive property of a silicon gate electrode, the charge stored in a floating gate may leak completely due to one defect, resulting in loss of information. The charge stored in the SONOS is discrete, so one defect does not cause all charge to be leaked. In addition, since an oxide layer is very thin, the programming and erasing current of the gate is large and the speed is fast.

The programming of the flash memory is to change the threshold voltage of the storage cell by injecting electrons into the floating gate or pulling the electrons out of the floating gate to change the charge amount of the floating gate to achieve the storage of Logic "1" or Logic "0". Two types of programming, operations are provided, one is channel programming based on F-N tunneling, which consumes glow operation power but has a slow speed and requires a very high voltage. The other is drain terminal injection based on CHIE (channel hot electron injection), this operation needs to provide enough channel current to generate enough channel hot electrons, of which a programming speed is fast, so CHEI programming is used much, FIG. 1 shows a circuit thereof.

CHEI uses a constant channel current to perform programming operation, however, as the programming progresses, the electrons are continuously written into the floating gate, and electrons enter the floating gate at a slower rate and a lower programming efficiency. For the storage cell of the flash memory, the current density that a channel can carry is determined by a manufacturing process, and thus injection efficiency cannot be increased by increasing the channel current. The traditional method is to increase programming time or to have multiple programming, which is not conducive to improving the performance of the flash memory.

SUMMARY OF THE PRESENT INVENTION

The object of the present invention is to improve the above-mentioned deficiencies in the prior art, to provide a programming, circuit and a programming method of a flash memory, and the fast memory to which the programming circuit is applied, so as to shorten programming time and ensure the performance of the flash memory.

In order to achieve the above object, the embodiments of the present invention provide the following technical solution:

A programming circuit of a flash memory comprises a programming transistor and a storage cell connected in series, wherein a gate of the programming transistor is connected to a word line, a gate of the storage cell is connected to a control gate, one end of the programming transistor is connected to a bit line, the other end of the programming transistor is connected to one end of the storage cell, and the other end of the storage cell is connected to a source line.

In the programming method implemented by the programming circuit of the above flash memory, the voltages with different voltage values are applied to a control gate in at least two timing segments, respectively, and the voltage applied in the latter timing segment is higher than the voltage applied in the previous timing segment.

In one embodiment, the storage cell is a P-type doped storage cell, a source electrode of the programming transistor is connected to a bit line, a drain electrode of the programming transistor is connected to a source electrode of the storage cell, and a drain electrode of the storage cell is connected to the source line. Further, during programming, operation, the bit line is connected to the voltage of 3.5V, the source, line is connected to the voltage of −2.5V, the word line is connected to the voltage of 0V, and the control gate is applied with the voltages of 0V and 2.5V in the previous and the latter timing segments, respectively, the substrates of the programming transistor and the storage cell are both connected to the voltage of 3.5V.

In another embodiment, the storage cell is an N-type doped storage cell, a source electrode of the programming transistor is connected to the bit line, the drain electrode of the programming transistor is connected to the drain electrode of the storage cell, and the source electrode of the storage cell is connected to the source line. Further, during the programming operation, the bit line is connected to the voltage of 3.5V, the source line is connected to the voltage of −2.5V, the word line is connected to the voltage of 0V, and the control gate is applied with the voltages of 0V and 2.5V in the previous and the latter timing sections, respectively, the substrate of the programming transistor is connected to the voltage of 3.5V, and the substrate of the storage cell is connected to the voltage of −2.5V.

The present invention also provides a flash memory to which a programming circuit of the present invention is applied.

Compared with the prior art, the programming circuit and a programming method of the present invention can improve the efficiency of the latter stage programming without increasing a channel current, thereby improving the efficiency of the entire programming process, shortening the total programming time, and improving the performance of the flash memory.

BRIEF DRAWINGS OF THE PRESENT INVENTION

In order to more clearly illustrate the technical solution of the embodiments of the present invention, the drawings used in the embodiments will be briefly described below, it should be understood that the following drawings show only certain embodiments of the present invention, and therefore should not be seen as a limitation on the scope, and those skilled in the art can obtain other related drawings according to the drawings without any creative work.

REFERENCE SIGNS IN THE FIGURES

Programming Transistor 10; Storage Cell 20; P-Type Substrate 30.

DETAILED DESCRIPTION

The technical solution in an embodiment of the present invention are clearly and completely described in the following with reference to the accompanying drawings in the embodiment of the present invention, it is obvious that the described embodiments are only a part of the embodiments of the present invention, but not all embodiments. The components of the embodiment of the invention, which are generally described and illustrated in the figures herein, may be arranged and designed in various different configurations. Therefore, the following detailed description of the embodiment of the present invention is not intended to limit the scope of the invention as claimed, but only to show the selected embodiment of the present invention. All other embodiments obtained by those skilled in the art based on the embodiment of the present invention without creative efforts are within the scope of the present invention.

Figure 1:
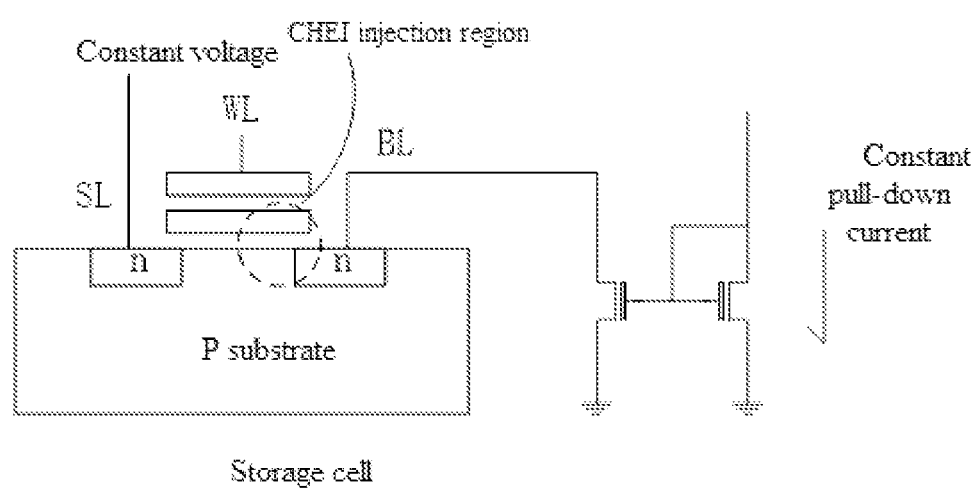
FIG. 1 is a circuit diagram that currently adopts CHEI programming.
Figure 2:
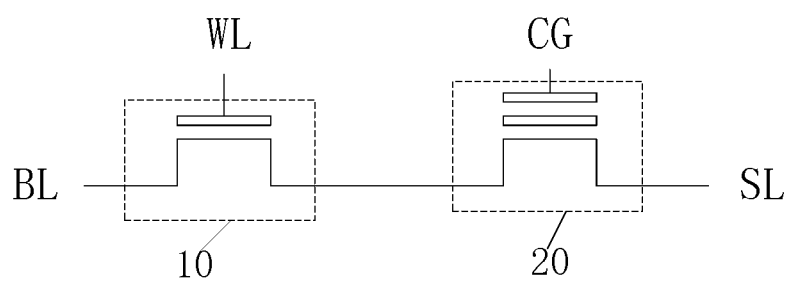
FIG. 2 is a circuit diagram of programming of a flash memory provided in an embodiment of the present invention.

Referring to FIG. 2, a programming circuit of a flash memory according to an embodiment of the present invention comprises a programming transistor 10, the programming transistor 10 is connected in series with a nonvolatile storage cell 20, and a gate of the programming transistor 10 is connected to a word Line (WL), one end (a source electrode or a drain electrode of the programming transistor 10) is connected to a bit line (BL), and the other end is connected to the source electrode/drain electrode of a storage cell 20.

A programming method for programming the flash memory by using the above programming circuit is as follows: applying a constant forward voltage between the BL and the SL (a source line), connecting WL to a constant voltage for turning on the programming transistor 10, and applying voltage to a control gate at least two timing segments, the value of the voltage applied in each timing segment is different, and the voltage applied in the latter segment is higher than the voltage applied in the previous segment, and an applied voltage offset can enable a channel of the storage cell 20 to be opened. By applying a higher voltage in the latter timing section, the longitudinal electric field of the storage cell 20 is increased, and the hot electron injection efficiency of the latter stage programming is improved, thereby shortening programming time.

The programming circuit structure proposed by the present invention does not limit the doped type of the storage cell 20. The storage cell 20 may be either P-type or N-type, in order to more clearly describe the content of the present invention, the embodiment is further described in the following.

Since a constant forward voltage is applied between the BL, and the SL, the forward voltage is usually applied at the BL, and a P-type transistor is generally selected during the process that the forward voltage is transferred, that is, the programming transistor 10 preferably uses a P-type doped transistor to eliminate the loss of a threshold voltage. For the storage cell 20, the P-type floating gate transistor generally has a higher hot electron injection efficiency than the N-type floating gate transistor.

Figure 3:
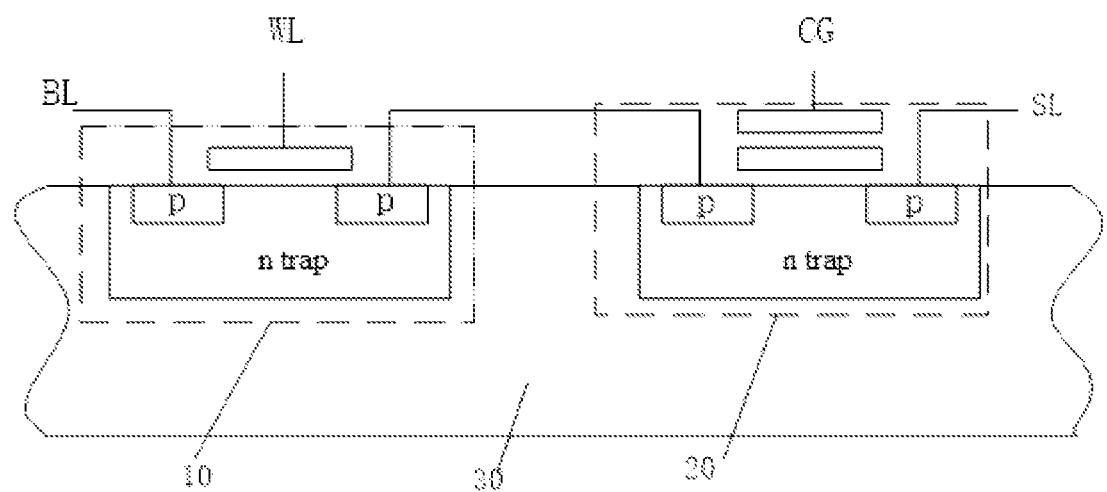
FIG. 3 is a connection diagram of a programming circuit applied to a P-type doped storage cell.

This embodiment selects an optimal combination scheme for description. As shown in FIG. 3, the programming transistor 10 and the storage cell 20 are both P-type doped, and the source electrode (or referred to as a source terminal) of the programming transistor 10 is connected to the BL, the gate is connected to the WL, and the drain electrode (or referred to as the drain electrode) is connected to the source terminal of the storage cell 20, the gate of the storage cell 20 is connected to the CG, and the drain terminal of the storage cell 20 is connected to the SL (distinguishing the source and drain: when the voltage is offset, most carriers flow from the source terminal to the drain terminal).

Figure 5:
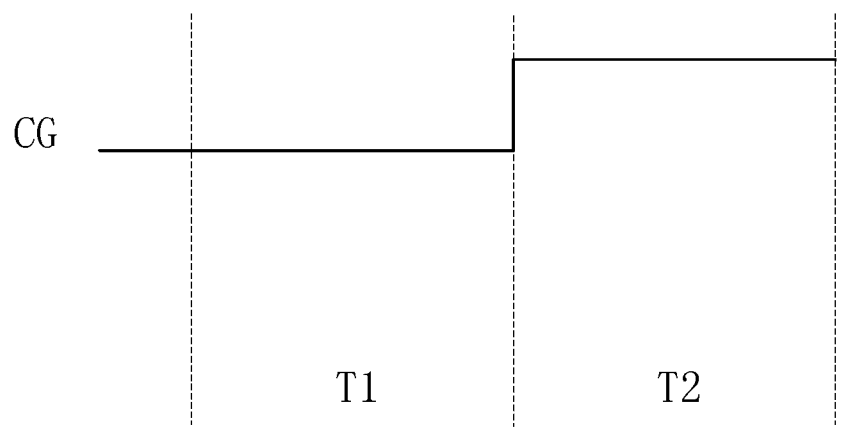
FIG. 5 is a diagram of voltage applied to a control gate at different timing segments.

In order to facilitate further understanding of the present embodiment, the voltage offset of each terminal in an embodiment is given, in this embodiment, when performing a programming operation, the BL is connected to the voltage of 3.5V, the SL is connected to the voltage of −2.5V, and the WL is connected to the voltage of 0V the voltages of the CG at the T1 segment and the T2 segment (described in only two periods T1 and T2 in the embodiment of the present invention) are 0 V and 2.5 V, respectively, as shown in FIG. 5, the substrates of the transistor 10 and the storage cell 20 are both applied with the voltage of 3.5V.

It should be noted that the voltage offset of each terminal given in this embodiment is only a typical value of the programming operation, and is not a specific value, that is, each voltage offset given in this embodiment may have other options and is not limited to the values given in this embodiment, the voltage applied to the WL can be guaranteed to turn on the programming transistor, and the voltage difference between the bit line and the source line can provide the channel current, and the voltage difference between the CG and the SL can facilitate electrons to be injected from the channel into the floating gate of the storage cell. For example, the BL is applied with, the voltage of 6V, the SL is applied with the voltage of 0V, the WL is applied with the voltage of 3.5V, the CG is applied with the voltage of 2.5V and 5V in T1 segment and T2 segment, respectively, and the substrate is applied with the voltage of 6V.

During the T1 period, the channel hot electrons are continuously written into the floating gate of the storage cell 20, since the storage cell 20 is the P-type doped, the threshold voltage of the storage cell 20 becomes lower and lower as the programming operation proceeds. Since the programming transistor Vgs is unchanged, the threshold voltage of the storage cell 20 is reduced, so the voltage of a source region of the storage cell 20 (a drain region of the programming transistor) is self-regulated, and the current flowing through the channel of the programming transistor 10 and the storage cell 20 is substantially unchanged. During the T2 period, the CG voltage is raised to 2.5V, at which time the channel of the storage cell 20 is still on (the threshold is lowered, Vgb still turns on the channel), the voltage of the source region of the storage cell 20 is self-regulated and raised, and the programming transistor Vgs is constant the current flowing through the channels of the programming transistor 10 and the storage cell 20 is substantially constant, however, the voltage difference between the gate and drain regions of the storage cell 20 is significantly increased, a longitudinal electric field is significantly increased, and the channel current is substantially constant to ensure that channel hot electrons generates rate, at which time the increase in the longitudinal electric field causes the efficiency of hot electron injection into the floating gate to be significantly increased, thereby shortening programming time.

Figure 4:
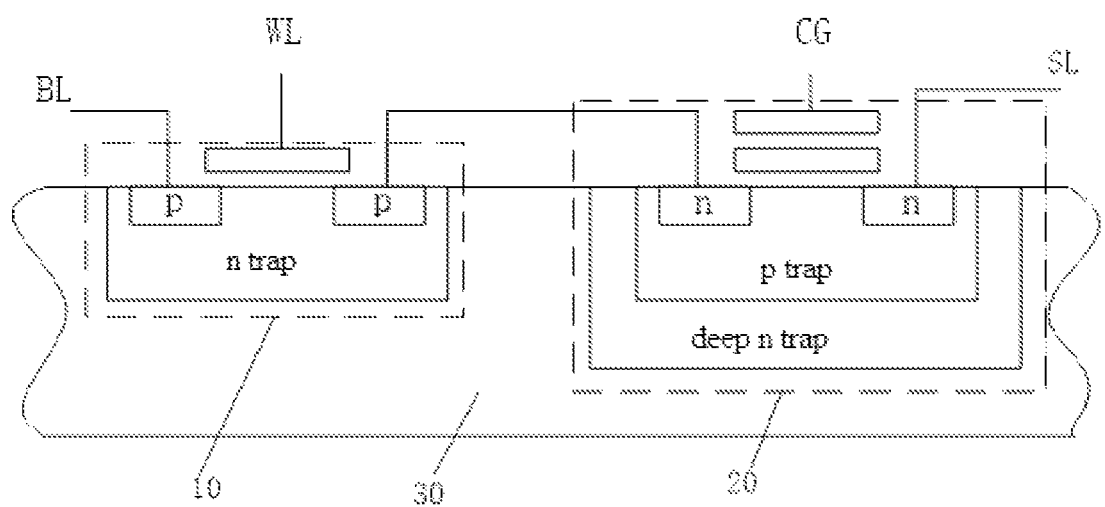
FIG. 4 is a connection diagram of a programming circuit applied to an N-type doped storage cell.

In another embodiment, as shown in FIG. 4, the programming transistor 10 is the P-type doped, the storage cell 20 is the N-type doped, the source terminal of the programming transistor 10 is connected to the BL, the gate is connected to the WL, and the drain terminal is connected, to the drain terminal of the storage cells 20, the gate of the storage cell 20 is connected to the CG, and the source terminal of the storage cell 20 is connected to the SL (distinguishing the source and drain: when the voltage is offset, the majority of the carriers flow from the source terminal to the drain terminal).

To facilitate the further understanding of the present embodiment, the voltage offset at each terminal is now given, which is only a typical value of the programming operation and is not a specific value, in the programming operation, BL is applied with the voltage of 3.5V, SL is applied with the voltage of −2.5V, the WL is applied with the voltage of 0V, and the voltages of the CG in the T1 period and the T2 period are 0 V (corresponding to the first voltage in the claims) and 2.5V (corresponding to the second voltage in the claims), respectively, as shown in FIG. 5, the substrate of the programming transistor is applied with the voltage of 3.5V, and the substrate of the storage cell 20 is applied with the voltage of −2.5V.

During the T1 period, the channel hot electrons are continuously written into the floating gate of the storage cell 20, since the storage cell 20 is the N-type doped, the threshold voltage of the storage cell 20 becomes higher and higher as the programming operation proceeds. Since the programming transistor Vgs is not changed, the threshold voltage of the storage cell 20 rises, so the voltage of the drain region of the storage cell 20 (the drain region of the programming transistor 10) is self-regulated and raised, and the current flowing through the channel of the programming transistor 10 and the storage cell 20 is basically unchanged. During the T2 period, the voltage of the CG is raised to 2.5V, at which time the channel of the storage cell 20 is still on (the threshold is raised, Vgb still turns on the channel), the programming transistor Vgs is unchanged, and the current flowing through the programming transistor 10 and the storage cell is basically unchanged, and the voltage of the drain region of the storage cell 20 is self-regulated and lowered, however, the voltage difference between the gate and the source region of the storage cell 20 is remarkably improved, the longitudinal electric field is remarkably improved, and the channel current is substantially constant to ensure that the channel hot electrons generates the rate, at which time the increase in the longitudinal electric field causes the efficiency of hot electron injection into the floating gate to be significantly increased, thereby shortening the programming time.

The programming circuit of the present invention can have variation in various ways, not only the programming transistor 10 can be made in a peripheral circuit but also the programming transistor 10 as part of storage cell 20 can be integrated in a memory array. The essence is to significantly increase the longitudinal line electric field component of the hot electron region under the premise of ensuring that the current of the storage cell 20 is substantially constant, thereby improving the efficiency of the latter stage programming.

The above is only the specific embodiment of the present invention, but the scope of the present invention is not limited thereto, and those skilled in the art can easily think of changes or substitutions within the technical scope of the present invention, which should be covered by the scope of the present invention.

We claim:

1. A programming circuit of a flash memory, comprising a programming transistor and a storage cell connected in series, wherein a gate of the programming transistor is connected to a word line, a gate of the storage cell is connected to a control gate, one end of the programming transistor is connected to a bit line, the other end of the programming transistor is connected to one end of the storage cell, the other end of the storage cell is connected to a source line, the programming transistor is a P-type doped transistor, voltages with different voltage values are applied to the control gate in at least two timing segments, respectively, and the voltage applied in the latter timing segment is higher than the voltage applied in the previous timing segment.

2. The programming circuit of the flash memory according to claim 1, characterized in that the storage cell is a P-type doped storage cell or an N-type doped storage cell.

3. The programming circuit of the flash memory according to claim 1, characterized in that the voltages of different voltage values are applied to the control gates in two timing segments.

4. The programming circuit of the flash memory according to claim 3, characterized in that the storage cell is the P-type doped storage cell, a source electrode of the programming transistor is connected to the bit line, and a drain electrode of the programming transistor is connected to the source electrode of the storage cell, and the drain electrode of the storage cell is connected to the source line.

5. The programming circuit of the flash memory according to claim 3, characterized in that the storage cell is the N-type doped storage cell, the source electrode of the programming transistor is connected to the bit line, and the drain electrode of the programming transistor is connected to the drain electrode of the storage cells, and the sources electrode of the storage cells is connected to the source line.

6. A programming method of a flash memory, comprising a programming transistor and a storage cell connected in series, wherein a gate of the programming transistor is connected to a word line, a gate of the storage cell is connected to a control gate, one end of the programming transistor is connected to a bit line, the other end of the programming transistor is connected to one end of the storage cell, and the other end of the storage cell is connected to a source line, voltages of different voltage values are applied to the control gate in at least two timing segments, respectively, and the voltage applied in the latter timing segment is higher than the voltage applied in the previous timing segment.

7. The programming method according to claim 6, characterized in that the voltages of different voltage values are applied to the control gate in two time segments, respectively, and the two timing segments are the first timing segment and the second timing segment.

8. The programming method according to claim 7, characterized in that the method comprises the steps of:

applying a constant forward voltage that provides a channel current between the bit line and the source line;

applying a constant voltage to the word line to turn on the programming transistor;

applying a constant first voltage to the control gate in the first timing segment and applying a constant second voltage to the control gate in the second timing segment.

9. The programming method according to claim 8, characterized in that if the programming transistor is a P-type doped transistor and the storage cell is a P-type doped storage cell, the voltage in the same size and the same direction is applied to a substrate of the programming transistor and a substrate of the storage cell; if the programming transistor is a P-type doped transistor and the storage cell is an N-type doped storage cell, voltages in different sizes and directions are applied to the substrate of the transistor and the substrate of the storage cell, respectively.

10. The programming method according to claim 9, characterized in that the constant voltage applied to the word line is the same as the constant first voltage applied to the control gate in the first timing segment.

* * * * *